(12) United States Patent
Lee

(10) Patent No.: US 10,534,399 B2
(45) Date of Patent: Jan. 14, 2020

(54) FLEXIBLE DISPLAY DEVICE

(71) Applicant: LG Display Co., Ltd., Seoul (KR)

(72) Inventor: SeYong Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 45 days.

(21) Appl. No.: 15/831,988

(22) Filed: Dec. 5, 2017

(65) Prior Publication Data

US 2018/0173277 A1 Jun. 21, 2018

(30) Foreign Application Priority Data

Dec. 16, 2016 (KR) .......................... 10-2016-017286

(51) Int. Cl.
*G06F 1/16* (2006.01)
*H01L 27/32* (2006.01)
(52) U.S. Cl.
CPC ........ *G06F 1/1652* (2013.01); *H01L 27/3276* (2013.01)
(58) Field of Classification Search
CPC .............. G06F 1/1652; H01L 27/3276; H01L 51/0097
See application file for complete search history.

(56) References Cited

U.S. PATENT DOCUMENTS

| 9,379,355 B1 | 6/2016 | Lee | |
|---|---|---|---|
| 2014/0002385 A1* | 1/2014 | Ka | ........................ G06F 1/1601 345/173 |
| 2015/0102298 A1* | 4/2015 | Namkung | ........... H01L 51/0097 257/40 |
| 2015/0179728 A1* | 6/2015 | Kwon | ................ H01L 27/3276 257/40 |
| 2016/0179229 A1* | 6/2016 | Ahn | ........................ G06F 3/041 345/173 |
| 2017/0364194 A1* | 12/2017 | Jang | ........................ G06F 3/0412 |
| 2018/0011514 A1* | 1/2018 | Yoo | ........................ G06F 1/1652 |
| 2018/0031880 A1* | 2/2018 | Kwak | ................ G02F 1/133621 |
| 2018/0033831 A1* | 2/2018 | An | ........................ G06F 3/0412 |
| 2018/0129352 A1* | 5/2018 | Kim | ..................... G06F 3/0412 |

* cited by examiner

*Primary Examiner* — Patrick N Edouard
*Assistant Examiner* — Eboni N Giles
(74) *Attorney, Agent, or Firm* — Morgan, Lewis & Bockius LLP

(57) ABSTRACT

Provided is a flexible display device. The flexible display device includes a flexible substrate, a plurality of sub-pixels, a plurality of lines, a pad part, an outer pad part, and a plurality of outer lines. The plurality of lines is connected to the plurality of sub-pixels. The pad part is connected to the plurality of lines. The outer pad part is disposed to be spaced from the pad part. The plurality of outer lines is connected to the outer pad part. The flexible substrate is bent in a first bending area where the plurality of lines is disposed, and the flexible substrate is bent in a second bending area where the plurality of outer lines is disposed.

13 Claims, 8 Drawing Sheets

FLEXIBLE DISPLAY DEVICE

CROSS-REFERENCE TO RELATED APPLICATIONS

This application claims the priority of Korean Patent Application No. 10-2016-0172867 filed on Dec. 16, 2016, in the Korean Intellectual Property Office, the disclosure of which is incorporated herein by reference.

BACKGROUND

Technical Field

The present disclosure relates to a flexible display device and more particularly, to a flexible display device having a narrow bezel with a reduced fraction defective.

Description of the Related Art

A display device that displays various kinds of information on a screen is a core device of the information and communication age. The display device is being researched and developed to be thinner, lighter, and portable and also capable of displaying a high-definition image. Examples of the display device include an organic light emitting display device that can self-illuminate, a plasma display device, and a liquid crystal display that requires a separate light source. The organic light emitting display device can be implemented without a separate light source and thus can be easily implemented as a flexible display device. In this case, flexible materials such as plastic, metal foil, etc. are used for a substrate of the flexible display device.

Meanwhile, studies are being conducted to curve or bend various portions of the display device using the flexibility of the flexible display device. Such studies have been conducted mainly for new design and User Interface (UI)/User Experience (UX), and some studies have been conducted to reduce the size of a bezel of the display device.

In order to reduce the size of a bezel, a part of a flexible substrate may be cut out. However, moisture may infiltrate into the flexible display device through the cut portion and may cause corrosion of lines in the flexible display device. Thus, a study for solving the corrosion of lines in the flexible display device caused by infiltration of moisture is needed.

SUMMARY

Accordingly, embodiments of the present disclosure are directed to a flexible display device that substantially obviates one or more of the problems due to limitations and disadvantages of the related art.

An aspect of the present disclosure is to provide a flexible display device having a narrow bezel.

Another aspect of the present disclosure is to provide a flexible display device in which corrosion of lines caused by moisture infiltrating through a cut portion of a flexible substrate is minimized.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display device comprises a flexible substrate, a plurality of sub-pixels, a plurality of lines, a pad part, an outer pad part, and a plurality of outer lines. The plurality of lines is connected to the plurality of sub-pixels. The pad part is connected to the plurality of lines. The outer pad part is disposed to be spaced from the pad part. The plurality of outer lines is connected to the outer pad part. The flexible substrate is bent in a first bending area where the plurality of lines is disposed, and the flexible substrate is bent in a second bending area where the plurality of outer lines is disposed. The flexible display device according to an exemplary embodiment of the present disclosure includes the flexible substrate which is bent in the second bending area where the plurality of outer lines is disposed and the first bending area where the plurality of lines is disposed. Thus, the pad part and the outer pad part may be overlapped with each other, and in the flexible display device, the size of an area where an image is not displayed may be reduced. Therefore, it is possible to provide the flexible display device having a narrow bezel. Further, the outer lines are not cut, but bent. Thus, it is possible to minimize corrosion of lines caused by moisture infiltrating through a cut portion and also possible to reduce a fraction defective of the flexible display device.

In another aspect, a flexible display device comprises a plurality of sub-pixels on a flexible substrate, a pad part electrically connected to the plurality of sub-pixels, and an outer pad part spaced from the pad part. The plurality of sub-pixels is disposed on a main area of the flexible substrate, the pad part is disposed on a pad area spaced from the main area, and the outer pad part is disposed on an outer pad area spaced from the pad part. A first bending area is positioned between the main area and the pad area, and a second bending area is positioned between the pad area and the outer pad area. The first bending area is bent such that a direction of a first normal vector perpendicular to an upper surface of the main area of the flexible substrate is opposite to a direction of a second normal vector perpendicular to an upper surface of the pad area of the flexible substrate. The second bending area is bent such that a direction of a third normal vector perpendicular to an upper surface of the outer pad area of the flexible substrate is opposite to the direction of the second normal vector.

Details of other exemplary embodiments will be included in the detailed description of the disclosure and the accompanying drawings.

According to the present disclosure, it is possible to provide a flexible display device including a flexible substrate which is bent such that a pad part and an outer pad part are positioned on a lower side of the flexible substrate. Thus, the flexible display device has a narrow bezel.

According to the present disclosure, an outer pad part and outer lines used only in a test process of a flexible display device are not cut, but bent. Thus, it is possible to minimize corrosion of the outer lines caused by cutting and also possible to improve the reliability of the flexible display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
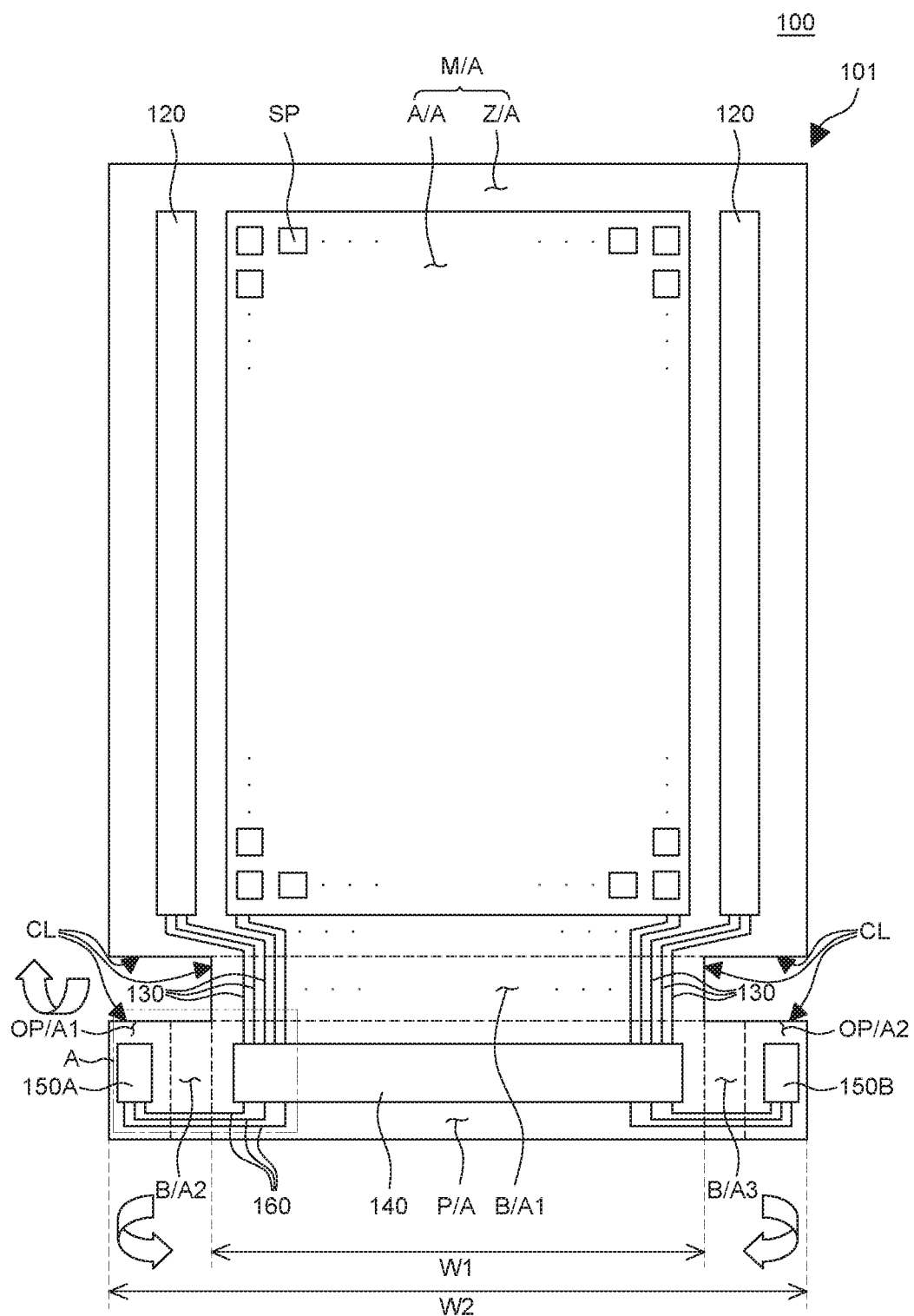
FIG. 1 is a schematic plan view of a flexible display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a schematic plan view of a flexible display device according to an exemplary embodiment of the present disclosure. Referring to FIG. 1, a flexible display device 100 includes a flexible substrate 101, a plurality of sub-pixels SP, a driver 120, a plurality of lines 130, a pad part 140, outer pad parts 150A and 150B, and a plurality of outer lines 160.

The flexible display device 100 according to an exemplary embodiment of the present disclosure is a bendable display device and can be implemented as various display devices. For example, the flexible display device 100 may be implemented as a liquid crystal display device, an organic light emitting display device, an electrophoretic display device, an electro-wetting display device, a quantum dot display device, and the like. In the present specification, the flexible display device 100 configured as an organic light emitting display device will be described.

The flexible substrate 101 is configured to support various components of the flexible display device 100 and includes at least one active area A/A. The active area A/A is an area where the plurality of sub-pixels SP is disposed and an image is displayed, and may also be referred to as a display area. At least one bezel area Z/A may be disposed around the active area A/A. That is, the bezel area Z/A may be in contact with one or more lateral sides of the active area A/A. For example, as illustrated in FIG. 1, the bezel area Z/A surrounds the square-shaped active area A/A. However, a shape of the active area A/A and a shape and a layout of the bezel area Z/A in contact with the active area A/A may not be limited to the example illustrated in FIG. 1. The active area A/A and the bezel area Z/A may have shapes suitable for a design of an electronic device equipped with the organic light emitting display device 100. For example, the active area A/A may have a pentagonal shape, a hexagonal shape, a circular shape, an oval shape, and the like.

In the active area A/A, the plurality of sub-pixels SP is disposed. Each of the sub-pixels SP includes an organic light emitting diode, a thin film transistor connected to the organic light emitting diode, and a capacitor. In FIG. 1, a specific illustration of the plurality of sub-pixels SP is omitted. The thin film transistor operates in association with the driver 120 positioned in the bezel area Z/A and controls the amount of driving current to be supplied to the organic light emitting diode.

The driver 120 is disposed in the bezel area Z/A of the flexible substrate 101 and supplies a driving signal to each of the sub-pixels SP. For example, the driver 120 may be a gate driver configured to supply a gate signal to the thin film transistor included in each of the sub-pixels SP. The gate driver includes various gate driving circuits, and the gate driving circuits may be formed directly on the flexible substrate 101. In this case, the driver 120 may also be referred to as a gate-in-panel (GIP). Meanwhile, a data driver configured to supply a data signal to the thin film transistor may be mounted on a printed circuit board (PCB) separated from the flexible substrate 101 and connected to the pad part 140 of the flexible substrate 101 through a connection circuit board such as a flexible printed circuit board (FPCB). Otherwise, the data driver of chip-on-film (COF) type or tape-carrier-package (TCP) type may be disposed on the connection circuit board and connected to the pad part 140 of the flexible substrate 101.

In some exemplary embodiments, the bezel area Z/A may include various additional components for generating various signals or driving the sub-pixels SP in the active area A/A. For example, an inverter circuit, a multiplexer, an electro static discharge circuit, and the like may be disposed in the bezel area Z/A.

As described above, the active area A/A and the bezel area Z/A of the flexible substrate 101 are areas where the plurality of sub-pixels SP and the driver 120 for driving the plurality of sub-pixels SP are disposed and constitute a front surface of the flexible display device 100. Therefore, the active area A/A and the bezel area Z/A may also be referred to as a main area M/A. Hereinafter, an area encompassing the active area A/A and the bezel area Z/A will be referred to as the main area M/A.

In a pad area P/A spaced from the main area M/A of the flexible substrate 101, the pad part 140 is disposed. The pad part 140 functions a connection terminal for supplying signals to the sub-pixels SP and the driver 120 disposed in the main area M/A. The pad part 140 includes a plurality of pads, and the plurality of pads is in contact with terminals on the connection circuit board such as an FPCB.

In a first bending area B/A1 of the flexible substrate 101, the plurality of lines 130 is disposed. The first bending area B/A1 refers to an area positioned between the pad area P/A and the main area M/A. An upper end of the first bending area B/A1 is in contact with the main area M/A and a lower end of the first bending area B/A1 is in contact with the pad area P/A. The flexible substrate 101 can be bent in the first bending area B/A1. The lines 130 are connected to the pad part 140 in the pad area P/A and extended to the main area M/A through the first bending area B/A1. The lines 130 are connected to the driver 120 and the sub-pixels SP in the main area M/A. The lines 130 transmit various electrical signals transmitted through the pad part 140 to the driver 120 in the bezel area Z/A and the sub-pixels SP in the active area A/A.

In outer pad areas OP/A1 and OP/A2 spaced from the pad area P/A of the flexible substrate 101, the outer pad parts 150A and 150B are disposed. That is, the outer pad parts 150A and 150B are disposed to be spaced from both ends of the pad part 140 and disposed in an outer portion of the flexible substrate 101. For convenience in explanation, the outer pad part 150A spaced from the left side of the pad part 140 in FIG. 1 is referred to as a first outer pad part 150A and the outer pad part 150B spaced from the right side of the pad part 140 is referred to as a second outer pad part 150B.

The first outer pad part 150A and the second outer pad part 150B are configured to receive a test signal for performing a test to the flexible display device 100 during a manufacturing process of the flexible display device 100. Specifically, each of the first outer pad part 150A and the second outer pad part 150B is connected to a test device, and may be applied with a test signal from the test device. The test on the flexible display device 100 may be, for example, a lighting test for checking an operation of the organic light emitting diode in each of the sub-pixels SP. The test on the flexible display device 100 is performed during the manufacturing process of the flexible display device 100. Therefore, in the completely manufactured flexible display device 100, the first outer pad part 150A and the second outer pad part 150B are not in contact with external terminals such as the test device.

In a second bending area B/A2 and a third bending area B/A3 of the flexible substrate 101, the outer lines 160 are disposed. The second bending area B/A2 is positioned between the pad area P/A and the first outer pad area OP/A1, and the third bending area B/A3 is positioned between the pad area P/A and the second outer pad area OP/A2. One side of the second bending area B/A2 is in contact with the pad area P/A and the other side of the second bending area B/A2 is in contact with the first outer pad area OP/A1. Also, one side of the third bending area B/A3 is in contact with the pad area P/A and the other side of the third bending area B/A3 is in contact with the second outer pad area OP/A2. Thus, the second outer pad area OP/A2, the third bending area B/A3, the pad area P/A, the second bending area B/A2, and the first outer pad area OP/A1 are positioned in parallel with each other. The flexible substrate 101 can be bent in the second bending area B/A2 and the third bending area B/A3.

The outer lines 160 are connected to the first outer pad part 150A and the second outer pad part 150B in the first outer pad area OP/A1 and the second outer pad area OP/A2, respectively. Further, the outer lines 160 are extended to the pad area P/A through the second bending area B/A2 and the third bending area B/A3. The outer lines 160 are connected to the pad part 140 in the pad area P/A. when the flexible display device 100 is tested, test signals transmitted through the outer pad parts 150A and 150B is transmitted to the pad part 140. Meanwhile, the pad part 140 is connected to the driver 120 and the sub-pixels SP through the lines 130. Therefore, the test signals transmitted through the outer lines 160 can be transmitted to the driver 120 and the sub-pixels SP.

The flexible substrate 101 can be bent. For example, the flexible substrate 101 can be bent in the first bending area B/A1 in contact with the main area M/A and the second bending area B/A2 and the third bending area B/A3 in contact with the pad area P/A. For example, the flexible substrate 101 can be bent in the first bending area B/A1 in a vertical direction as indicated by an arrow in FIG. 1. Further, the flexible substrate 101 can be bent in the second bending area B/A2 and the third bending area B/A3 in a horizontal direction as indicated by an arrow in FIG. 1. However, a bending direction of the flexible substrate 101 is not limited thereto, and can be bent in a combination of Vertical, horizontal, and diagonal directions on the basis of a design required for the flexible display device 100.

The flexible substrate 101 may be formed of a plastic material having flexibility. For example, the flexible substrate 101 may be implemented as a thin film plastic film formed of a polymer such as polyimide, polyethylene naphthalate (PEN), polyethylene terephthalate (PET), etc. The flexible substrate 101 may have a thickness of, for example, 5 μm to 50 μm for excellent flexibility. If the flexible substrate 101 has a thickness of less than 5 μm, the flexible substrate 101 may tear easily, and if the flexible substrate 101 has a thickness of more than 50 μm, the flexible substrate 101 may not be bent easily.

Apart of the flexible substrate 101 is to be cut out. For example, as illustrated in FIG. 1, both lateral portions of the first bending area B/A1 of the flexible substrate 101 may be cut along a cutting line CL. Since a part of the flexible substrate 101 is cut out, a width $W_1$ of the first bending area B/A1 may become smaller than a width $W_2$ of the main area M/A. Further, the width W1 of the first bending area B/A1 may become smaller than a total width W2 of the second outer pad area OP/A2, the third bending area B/A3, the pad area P/A, the second bending area B/A2, and the first outer pad area OP/A1 positioned in parallel with each other. Thus, a boundary line of the flexible substrate 101 is formed into a "C" shape on both lateral portions of the first bending area B/A1. A cutting process for cutting a part of the flexible substrate 101 may be performed after the test process is performed during the manufacturing process of the flexible display device 100. If necessary, another portion may also be cut together with both lateral portions of the first bending area B/A1 during the cutting process. Since the flexible substrate 101 is cut along the cutting line CL, when the first bending area B/A1 is bent, the protrusion of the pad area P/A of the flexible substrate 101 to the outside of a boundary line of the main area M/A in the flexible substrate 101 can be minimized. Details thereof will be described later with reference to FIG. 4A and FIG. 4B.

The pad part 140 includes a plurality of pads 141 connected to the plurality of lines 130, respectively, and the outer pad parts 150A and 150B include a plurality of outer pads 151A connected to the plurality of outer lines 160, respectively. Hereinafter, the pads 141 and the outer pads 151A will be described in detail with reference to FIG. 2 and FIG. 3.

Figure 2:
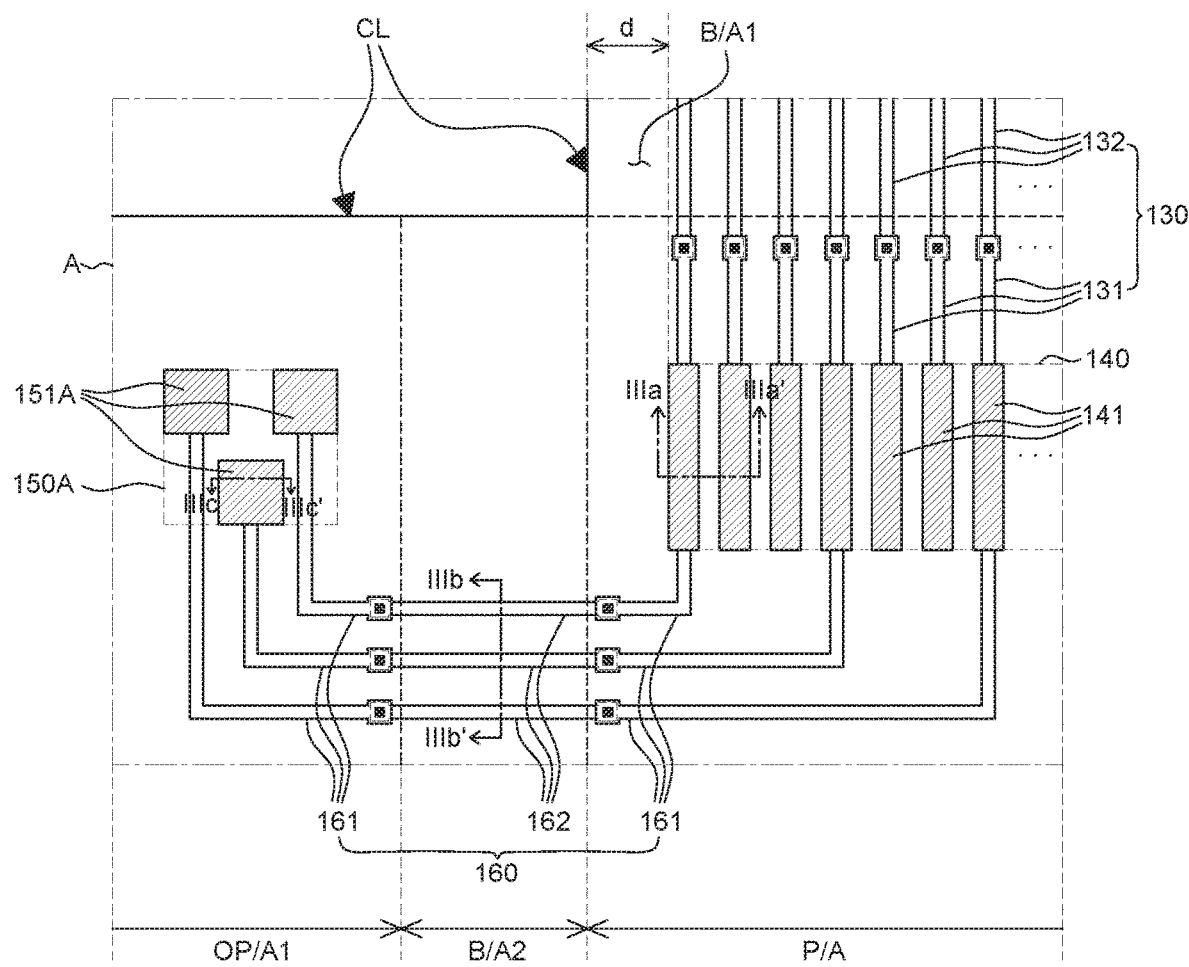
FIG. 2 is a schematic enlarged plan view of an area A illustrated in FIG. 1.
Figure 3:
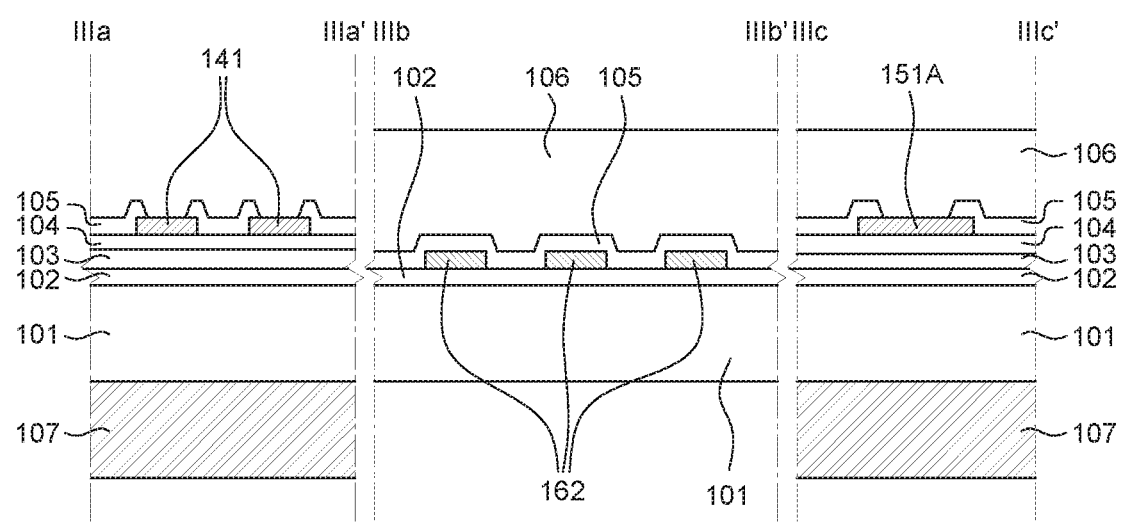
FIG. 3 is a cross-sectional view taken along a line IIIa-IIIa', a line IIIb-IIIb', and a line IIIc-IIIc' illustrated in FIG. 2.

FIG. 2 is a schematic enlarged plan view of an area A illustrated in FIG. 1. FIG. 3 is a cross-sectional view taken along a line IIIa-IIIa', a line IIIb-IIIb', and a line IIIc-IIIc' illustrated in FIG. 2. FIG. 2 and FIG. 3 illustrate only the first outer pad part 150A disposed in the first outer pad area OP/A1 but do not illustrate the second outer pad part 150B disposed in the second outer pad area OP/A2. However, the first outer pad part 150A and the second outer pad part 150B are different only in position but identical to each other in configuration. Therefore, in the following, the first outer pad part 150A will be described.

Referring to FIG. 2, the plurality of lines 130 includes first lines 131 and second lines 132. The first lines 131 are connected to the pads 141, respectively, in the pad area P/A. The second lines 132 are extended in the first bending area B/A1 and connected to the first lines 131. The first lines 131 and the second lines 132 are disposed on different planes from each other. The first lines 131 are disposed on a plane positioned higher than a plane on which the second lines 132 are disposed, but may not be limited thereto. The first lines 131 and the second lines 132 may be disposed on the same plane, and the first lines 131 may be positioned on a plane positioned lower than a plane on which the second lines 132 are disposed. That is, a positional relationship between the first lines 131 and the second lines 132 may be determined depending on a design of the flexible display device 100 and a resistance and bending durability of each line, and may not be limited to the example illustrated in FIG. 2.

Each of the plurality of outer lines 160 includes a first outer line 161 and a second outer line 162. The first outer lines 161 are connected to the pads 141, respectively, in the pad area P/A and the outer pads 151, respectively, in the first outer pad area OP/A1. The second outer lines 162 are extended in the second bending area B/A2 and connected to the first outer lines 161. The first outer lines 161 are disposed on the same plane as the first lines 131, and the second outer lines 162 are disposed on the same plane as the second lines 132. However, the first outer lines 161 and the second outer lines 162 are not necessarily disposed on different planes from each other, but may be disposed on the same plane.

The outer lines 160 are connected to some of the pads 141 in the pad part 140. As described above, the outer lines 160 are configured to transmit test signals to the pads 141 in the test process performed during the manufacturing process of the flexible display device 100. Specifically, after the sub-pixels SP and the driver 120 are formed on the flexible substrate 101, a test process for checking whether the sub-pixels SP and the driver 120 operate properly may be performed. For example, a lighting test for checking whether the organic light emitting diode in each of the sub-pixels SP emits light properly may be performed. In this case, the first outer pad part 150A and the second outer pad part 150B are connected to a test device, and a test signal transmitted to the first outer pad part 150A and the second outer pad part 150B is transmitted to some pads 141 through some outer lines 160, respectively. The test signal transmitted to some pads 141 may be transmitted to some sub-pixels SP through some lines 130 connected to some pads 141, respectively. The test signal may cause organic light emitting diodes in some sub-pixels SP to emit light, and the lighting test may be performed to some sub-pixels SP.

The pads 141 of the pad part 140 are connected to the first lines 131, respectively, in the pad area P/A and disposed on the same plane as the first lines 131. Also, the first outer pads 151A of the first outer pad part 150A are connected to the first outer lines 161, respectively, and disposed on the same plane as the first outer lines 161.

One side of an outermost pad among the pads 141 in the pad part 140 is spaced at a predetermined distance d from a boundary line of the second bending area B/A2 facing the one side of the outermost pad. For convenience in explanation, the distance d from the one side of the outermost pad to the boundary line of the second bending area B/A2 is defined as a separation distance d. Meanwhile, if the flexible substrate 101 is bent, the boundary line of the second bending area B/A2 corresponds to a bending start point and a bending end point. The separation distance d provides a margin space that minimizes damage to the pads 141 caused by the bending of the flexible substrate 101. Specifically, when in the second bending area B/A2, the flexible substrate 101 is bent, a part of the pad area P/A may be curved. In this case, a tensile stress may be generated in a part of the pad area P/A adjacent to the second bending area B/A2, and a pad 141 adjacent to the second bending area B/A2 may be damaged by the tensile stress. In this case, the outermost pad which is most adjacent to the boundary line of the second bending area B/A2 is applied with the greatest tensile stress. Thus, the outermost pad needs to be sufficiently spaced from the boundary line of the second bending area B/A2. The strength of a tensile stress applied to an area adjacent to the second bending area B/A2 is determined depending on a bending radius of the flexible substrate 101 bent in the second bending area B/A2. Therefore, the separation distance d may be determined properly depending on the bending radius of the flexible substrate 101 bent in the second bending area B/A2. For example, the separation distance d may be 600 μm or more. If the separation distance d is less than 600 μm, the outermost pad may be damaged by bending of the flexible substrate 101, which may cause deterioration in reliability of the flexible display device 100. However, if the separation distance d is 600 μm or more, the outermost pad is sufficiently spaced from the second bending area B/A2. Therefore, the outermost pad may be disposed on a flat surface of the flexible substrate 101 which is hardly bent and may be applied with a sufficiently small tensile stress. Meanwhile, as the separation distance d is increased, the tensile stress applied to the outermost pad may be decreased. Therefore, the greater separation distance d is more preferable. However, in this case, the area where the pads 141 can be disposed is reduced. Therefore, the separation distance d may be selected to be suitable for a design of the flexible display device 100.

The lines 130, the outer lines 160, the pads 141, and the first outer pads 151A are formed of a conductive material having a low resistance in order to easily transmit an electrical signal. For example, the lines 130, the outer lines 160, the pads 141, and the first outer pads 151A may be formed of aluminum (Al), titanium (Ti), molybdenum (Mo), and copper (Cu). Particularly, the second lines 132 and the second outer lines 162 disposed in the bending areas B/A1, B/A2, and B/A3 are applied with a stress caused by bending of the flexible substrate 101. Therefore, these lines need to be designed to endure the stress and have a low resistance as compared with the lines disposed in the pad area P/A and the first outer pad area OP/A1. Further, these lines need to have sufficient flexibility so as to enable easy bending of the flexible substrate 101. To this end, the second lines 132 and the second outer lines 162 may have a multi-layer structure in which a plurality of metal layers is laminated. For example, the second lines 132 and the second outer lines 162 may include an aluminum layer between titanium layers (Ti/Al/Ti), an aluminum layer between upper and lower molybdenum layers (Mo/Al/Mo), a copper layer between titanium layers (Ti/Cu/Ti), or a copper layer between upper and lower molybdenum layers (Mo/Cu/Mo). The second lines 132 and the second outer lines 162 having such a multi-layer structure have a low contact resistance between the metal layers while maintaining sufficient flexibility and thus may have excellent conductivity.

Meanwhile, FIG. 2 illustrates the linearly extended lines 130 and outer lines 160. However, the lines 130 and the outer lines 160 may be extended in a zigzag pattern. Specifically, the second lines 132 disposed in the first bending area B/A1 and the second outer lines 162 disposed in the second bending area B/A2 and the third bending area B/A3 may be extended in a zigzag pattern. As described above, the flexible substrate 101 can be bent in the first bending area B/A1, the second bending area B/A2, and the third bending area B/A3. Therefore, a stress may be generated in the second lines 132 disposed in the first bending area B/A1 and the second outer lines 162 disposed in the second bending area B/A2 and the third bending area B/A3. If the second lines 132 and the second outer lines 162 are extended in a zigzag pattern, a stress applied to the second lines 132 and the second outer lines 162 may be dispersed. Specifically, if the flexible substrate 101 is bent, the greatest stress is applied to the second line 132 and the second outer line 162 in a direction parallel to the bending direction. For example, as illustrated in FIG. 1, if the flexible substrate 101 is bent in the first bending area B/A in a vertical direction, a displacement in the vertical direction of the flexible substrate 101 is the greatest. Therefore, the greatest stress is applied to the second line 132 in the vertical direction of the flexible substrate 101. If the second line 132 is extended in a direction perpendicular to the bending direction of the flexible substrate 101, the greatest stress is applied to the second line 132 and the second line 132 is more likely to be damaged. However, if the second line 132 is extended in a zigzag pattern, the second line 132 is extended in a diagonal direction. Therefore, a portion of the second line 132 extended in the vertical direction can be reduced and a stress applied to the second line 132 in the vertical direction can be reduced.

Referring to FIG. 3, a passivation layer 105 configured to protect the lines 130 and the outer lines 160 against external environments is disposed on the lines 130 and the outer lines 160. The passivation layer 105 is disposed to cover all of the first lines 131 in the pad area P/A, the second lines 132 in the first bending area B/A1, the first outer lines 161 in the first outer pad area OP/A1, and the second outer lines 162 of the second bending area B/A2. The passivation layer 105 suppresses corrosion of or damage to the lines 130 and the outer lines 160 caused by moisture or foreign materials. To this end, the passivation layer 105 may be formed of an inorganic insulating material. For example, the passivation layer 105 may be formed of an inorganic insulating material such as silicon nitride (SiNx), silicon oxide (SiOx). The passivation layer 105 may have a single layer structure or multi-layer structure formed of an inorganic insulating material.

Meanwhile, the pads 141 of the pad part 140 need to be brought into contact with the connection circuit board, and, thus, upper surfaces of the pads 141 are not covered by the passivation layer 105. In this case, the passivation layer 105 in the pad area P/A includes an opening part through which the upper surfaces of the pads 141 are exposed. Likewise, the first outer pads 151A of the first outer pad part 150A need to be brought into contact with the test device during the test process, and, thus, upper surfaces of the first outer pads 151A are not covered by the passivation layer 105. Therefore, the passivation layer 105 in the first outer pad area OP/A1 includes an opening part through which the upper surfaces of the first outer pads 151A are exposed.

In some exemplary embodiments, the pads of the pad part 140, the first outer pad part 150A, and the second outer pad part 150B may be formed of a plurality of metal layers. For example, under the pads 141 of the pad part 140, the first outer pads 151A of the first outer pad part 150A, and the second outer pads of the second outer pad part 150B, an additional metal electrode connected to each of the pads may be disposed. In this case, it is possible to suppress damage (for example, pad perforation) to each pad caused by a contact terminal of the connection circuit board or test device when the pads 141 are in contact with the connection circuit board or the first outer pads 151A and the second outer pads are connected to the test device. In this case, the additional metal electrode may be formed using the same metal as the second line 132 and the second outer line 162.

A protection layer 106 configured to cover the passivation layer 105 is disposed to cover the second lines 132 and the second outer lines 162 in the first bending area B/A1, the second bending area B/A2, and the third bending area B/A3. The protection layer 106 is configured to protect the second lines 132 and the second outer lines 162 in the bending areas B/A1, B/A2, and B/A3 and may be formed of an acrylic-based resin composition. As described above, the flexible substrate 101 is bent in the bending areas B/A1, B/A2, and B/A3, and, thus a great stress is applied to the bending areas B/A1, B/A2, and B/A3. Particularly, if the flexible substrate 101 is bent downwards, a great tensile stress may be generated in an upper surface of the flexible substrate 101. The passivation layer 105 covering the second lines 132 and the second outer lines 162 is formed as a brittle inorganic insulating layer. Thus, if a tensile stress is applied to the passivation layer 105, the passivation layer 105 may be broken or cracked easily by the stress. If the passivation layer 105 is cracked, an infiltration path for moisture may be formed, and, thus, the second lines 132 and the second outer lines 162 may be exposed to moisture. The protection layer 106 is formed to cover the passivation layer 105. Thus, even if the passivation layer 105 is cracked, the protection layer 106 protects the second lines 132 and the second outer lines 162 against infiltration of moisture from the outside into the second lines 132 and the second outer lines 162. The protection layer 106 may be formed of an acrylic-based resin composition which is resistant to moisture and not cracked easily by a bending stress. In this case, the second lines 132 and the second outer lines 162 can be effectively protected against bending of the flexible substrate 101.

Further, the protection layer 106 may move a neutral plane to minimize damage to the second lines 132 and the second outer lines 162. The neutral plane refers to a virtual plane where a compressive stress and a tensile stress cancel each other out when a structure is bent, and, thus, a stress is not applied. That is, the neutral plane refers to a virtual plane where the sum of stresses generated in the flexible substrate 101 is 0 (zero) when the flexible substrate 101 is bent. If the neutral plane exists at a position where the second lines 132 and the second outer lines 162 are disposed, a stress is not applied to the second lines 132 and the second outer lines 162. Thus, damage to the second lines 132 and the second outer lines 162 caused by a stress can be minimized. Further, if the neutral plane exists above the second lines 132 and the second outer lines 162, the second lines 132 and the second outer lines 162 are applied with a great compressive stress rather than a tensile stress. Damage to the second lines 132 and the second outer lines 162 is mainly caused by cracks in the second lines 132 and the second outer lines 162. The cracks are generated when interatomic bonds of a metal material constituting the second lines 132 and the second outer lines 162 are broken by a tensile stress. Thus, the second lines 132 and the second outer lines 162 applied with a compressive stress may be less likely to be damaged than the second lines 132 and the second outer lines 162 applied with a tensile stress. Therefore, if the neutral plane is positioned on or above the plane where the second lines 132 and the second outer lines 162 are disposed, damage to the second lines 132 and the second outer lines 162 can be minimized.

A position of the neutral plane may be determined by a thickness and an elastic modulus of the protection layer 106. Thus, a thickness and an elastic modulus of the protection layer 106 are determined in order for the neutral plane to be on or above the plane where the second lines 132 and the second outer lines 162 are disposed. For example, the protection layer 106 may have a thickness of 120 μm and an elastic modulus of 0.4 GPa, but may not be limited thereto.

Meanwhile, the protection layer 106 is formed in the first outer pad area OP/A1 and the second outer pad area OP/A2 to cover the first outer pad part 150A in the first outer pad area OP/A1 and the second outer pad part 150B in the second outer pad area OP/A2. As described above, the first outer pad part 150A and the second outer pad part 150B are provided for a test on the flexible display device 100. Thus, the first outer pad part 150A and the second outer pad part 150B are connected to the test device during a test process, but are not in contact with any terminal after the test is ended. When the test device is separated after the test is ended, an upper surface of the first outer pad part 150A and an upper surface of the second outer pad part 150B may be exposed to external environments. The protection layer 106 is formed after the test is ended and formed to cover the first outer pad part 150A and the second outer pad part 150B. Therefore, even if the upper surfaces of the first outer pad part 150A and the second outer pad part 150B are exposed after the test process, the first outer pad part 150A and the second outer pad part 150B can be sealed by the protection layer 106. Also, damage to the first outer pad part 150A and the second outer pad part 150B caused by moisture or foreign materials can be minimized.

The protection layer 106 is not disposed on the pads 141 of the pad part 140. That is, the pad part 140 is brought into contact with the connection circuit board after the test on the flexible display device 100 is ended, and the upper surfaces of the pads 141 are covered by the connection circuit board. Thus, the pads 141 can be protected. Also, the pad area P/a is not bendable. Thus, the pads 141 may not be damaged by bending.

Meanwhile, in the pad area P/A, the first outer pad area OP/A1, the second outer pad area OP/A2, and the main area M/A in which the flexible substrate 101 is not bent, one or more supporting substrates 107 are disposed under the flexible substrate 101 to increase the strength and/or rigidity of the flexible substrate 101. The supporting substrate 107 is not disposed in the bending areas B/A1, B/A2, and B/A3 requiring flexibility for bending. The supporting substrate 107 supports the flexible substrate 101 so as not to be rolled during a process of forming the components, such as the thin film transistor, the organic light emitting diode, the driver 120, the pad part 140, and the outer pad parts 150A and 150B, on the flexible substrate 101.

The supporting substrate 107 may be configured as a thin plastic film formed of a combination of polyimide, polyethylene naphthalate, polyethylene terephthalate, and other suitable polymers. Further, the supporting substrate 107 may be implemented as a polymer film including a polymer material combined with thin glass, metal foil shielded with a dielectric material, a multi-layer polymer, nanoparticles or microparticles.

Further, the lines 130, the outer lines 160, the pads 141, and the first outer pads 151A are disposed on a buffer layer 102 on the flexible substrate 101. The buffer layer 102 suppresses infiltration of moisture or impurities through the flexible substrate 101 and flattens an upper part of the flexible substrate 101. The buffer layer 102 may be formed to have a multi-layer structure in which silicon nitride and silicon oxide are laminated alternately. However, the buffer layer 102 is not an essential component, and whether or not to form the buffer layer 102 is determined depending on the kind of the flexible substrate 101 or the kind of a thin film transistor formed in the active area A/A.

A gate insulating layer 103 and an interlayer insulating layer 104 are disposed on the buffer layer 102. The gate insulating layer 103 and the interlayer insulating layer 104 are configured to insulate each of electrodes of the thin film transistors formed in the active area A/A. The gate insulating layer 103 and the interlayer insulating layer 104 may be formed in the main area M/A, the pad area P/A, the first outer pad area OP/A1, and the second outer pad area OP/A2 in which the flexible substrate 101 is not bent. Similar to the passivation layer 105, the gate insulating layer 103 and the interlayer insulating layer 104 may be formed to have a single layer structure or multi-layer structure formed of silicon nitride and silicon oxide. The gate insulating layer 103 and the interlayer insulating layer 104 are not formed on the bending areas B/A1, B/A2, and B/A3. If the gate insulating layer 103 and the interlayer insulating layer 104 are formed on the bending areas B/A1, B/A2, and B/A3, a thickness of the bending areas B/A1, B/A2, and B/A3 may be increased, which may hinder bending of the flexible substrate 101. Also, the gate insulating layer 103 and the interlayer insulating layer 104 formed of an inorganic insulating material with high rigidity may hinder bending of the flexible substrate 101.

The flexible display device 100 according to an exemplary embodiment of the present disclosure is bent in the first bending area B/A1, the second bending area B/A2, and the third bending area B/A3. Therefore, the size of the area where an image is not displayed can be minimized. Thus, it is possible to provide the flexible display device 100 having a narrow bezel. Details thereof will be described with reference to FIG. 4A and FIG. 4B.

Figure 4A:
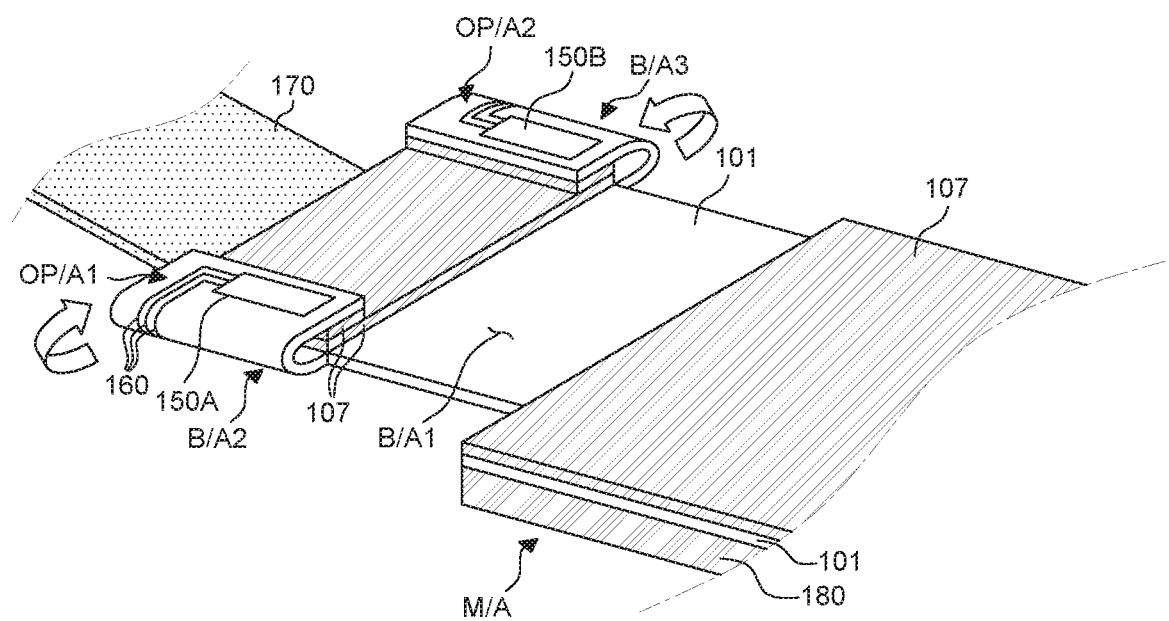
FIG. 4A and FIG. 4B are perspective views provided to explain a process of bending the flexible display device according to an exemplary embodiment of the present disclosure.
Figure 4B:
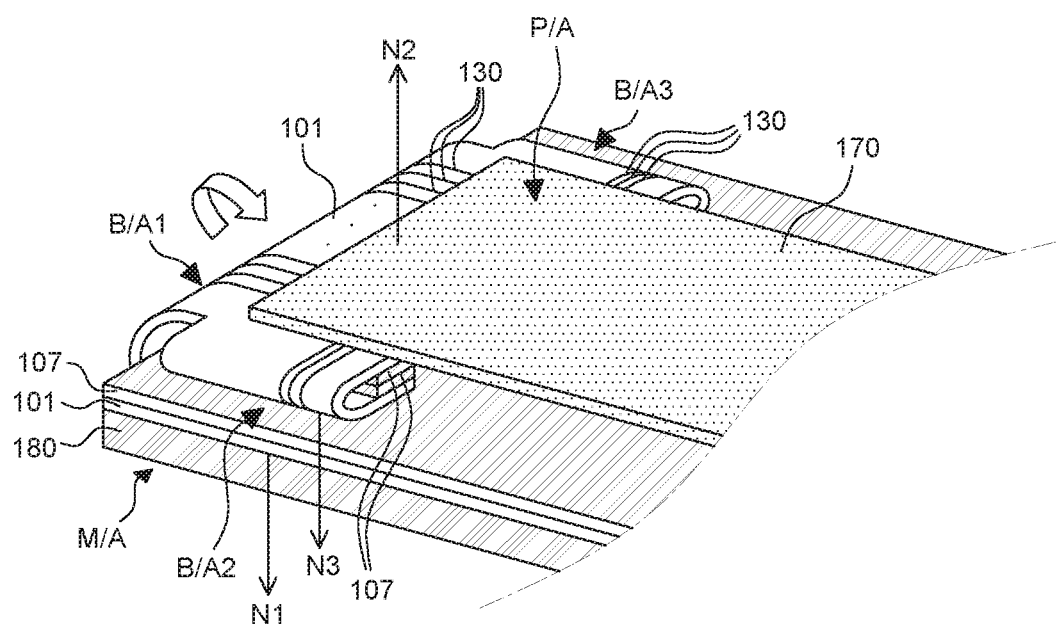

FIG. 4A and FIG. 4B are perspective views provided to explain a process of bending the flexible display device 100 according to an exemplary embodiment of the present disclosure. FIG. 4A and FIG. 4B schematically illustrate the driver 120 and the sub-pixels SP disposed in the main area M/A as a single layer 180. Further, the flexible substrate 101 is illustrated as reversed to better show bending of the first bending area B/A1, the second bending area B/A2, and the third bending area B/A3. Thus, an upward direction in FIG. 4A and FIG. 4B is actually a downward direction of the flexible substrate 101 and a downward direction in FIG. 4A and FIG. 4B is actually an upward direction of the flexible substrate 101.

Referring to FIG. 4A, the flexible substrate 101 is bent in the second bending area B/A2 and the third bending area B/A3. Specifically, in the second bending area B/A2 and the third bending area B/A3, the flexible substrate 101 of the first outer pad area OP/A1 and the second outer pad area OP/A2 is bent to the downward direction of the flexible substrate 101 along an arrow direction in FIG. 4A. Thus, an upper surface of the first outer pad part 150A in the first outer pad area OP/A1 faces the same direction as a lower surface of the flexible substrate 101 in the main area M/A. Further, an upper surface of the second outer pad part 150B in the second outer pad area OP/A2 faces the same direction as a lower surface of the flexible substrate 101 in the main area M/A.

Referring to FIG. 4B, the flexible substrate 101 is bent in the first bending area B/A1. Specifically, in the first bending area B/A1, the flexible substrate 101 of the pad area P/A is bent to the downward direction of the flexible substrate 101 along an arrow direction in FIG. 4B. Since the flexible substrate 101 of the first outer pad area OP/A1 and the second outer pad area OP/A2 is bent to the downward direction, the upper surface of the first outer pad part 150A in the first outer pad area OP/A1 faces the lower surface of the flexible substrate 101 in the main area M/A. Further, the upper surface of the second outer pad part 150B in the second outer pad area OP/A2 faces the lower surface of the flexible substrate 101 in the main area M/A.

In this case, the pad part 140 in the pad area P/A may be positioned under the flexible substrate 101 in the main area M/A, and a connection circuit board 170 in contact with the pad part 140 may be positioned under the flexible substrate 101 and connected to a system board.

As the flexible substrate 101 is bent in the first bending area B/A1, the second bending area B/A2, and the third bending area B/A3, a normal vector of the flexible substrate 101 in each area is changed in direction. Herein, the normal vector of the flexible substrate 101 is defined as a vector perpendicular to the upper surface of the flexible substrate 101. As the flexible substrate 101 is bent in the first bending area B/A1, a second normal vector N2 of the flexible substrate 101 in the pad area P/A faces a direction opposite to a direction of a first normal vector N1 of the flexible substrate 101 in the main area M/A. Further, as the flexible substrate 101 is bent in the second bending area B/A2 and the third bending area B/A3, a third normal vector N3 in the first outer pad area OP/A1 and a normal vector in the second outer pad area OP/A2 of the flexible substrate 101 face a direction opposite to the direction of the second normal vector N2 and face the same direction as the first normal vector N1. Therefore, the first outer pad part 150A in the first outer pad area OP/A1 and the second outer pad part 150B in the second outer pad area OP/A2 are overlapped with the pad part 140 in the pad area P/A, and the outer pad parts 150A and 150B are overlapped with the pad part 140.

Meanwhile, after the flexible substrate 101 is bent in the second bending area B/A2 and the third bending area B/A3, the flexible substrate 101 is bent in the first bending area B/A1. Thus, a bending radius of the flexible substrate 101 bent in the first bending area B/A1 is greater than a bending radius of the flexible substrate 101 bent in the second bending area B/A2 and the third bending area B/A3. Therefore, a tensile stress applied to the upper surface of the flexible substrate 101 in the second bending area B/A2 and the third bending area B/A3 is greater than a tensile stress applied to the upper surface of the flexible substrate 101 in the first bending area B/A1. In this case, the outer lines 160 extended in the second bending area B/A2 and the third bending area B/A3 are applied with a greater tensile stress and more likely to be damaged than the lines 130 extended in the first bending area B/A1. However, as described above, the protection layer 106 configured to move the neutral plane is disposed in the first bending area B/A1, the second bending area B/A2, and the third bending area B/A3. Thus, damage to the outer lines 160 in the second bending area B/A2 and the third bending area B/A3 can be minimized. Even if the outer lines 160 are damaged despite the protection of the protection layer 106, the outer lines 160 are used only in a test process, and, thus, a normal operation of the flexible display device 100 may not be affected. Meanwhile, the flexible substrate 101 bent in the first bending area B/A1 has a greater bending radius than the flexible substrate 101 bent in the second bending area B/A2 and the third bending area B/A3. Therefore, a relatively small tensile stress is applied to the lines 130 extended in the first bending area B/A1. Thus, the lines 130 extended in the first bending area B/A1 may be less likely to be damaged than the outer lines 160.

In some exemplary embodiments, a structure for maintaining the bending radius of the flexible substrate 101 bent in the first bending area B/A1 may be disposed under the flexible substrate 101. However, if the structure is disposed, a total thickness of the flexible display device 100 may be increased. Therefore, such a structure may be omitted to implement the slim flexible display device 100.

Meanwhile, as described above, a part of the flexible substrate 101 is cut along the cutting line CL in the first bending area B/A1, and, thus, the width W1 of the first bending area B/A1 becomes smaller than the width W2 of the main area M/A. Also, the flexible substrate 101 is bent in the second bending area B/A2 and the third bending area B/A3, and, thus, the first outer pad area OP/A1 and the second outer pad area OP/A2 of the flexible substrate 101 are overlapped with the pad area P/A and a width of the flexible substrate 101 may be reduced. If a part of the flexible substrate 101 is not cut and the first outer pad area OP/A1 and the second outer pad area OP/A2 of the flexible substrate 101 are not overlapped with the pad area P/A, a width of the flexible substrate 101 bent to a downward direction of the main area M/A may be equal to the width W2 of the main area M/A. If the flexible substrate 101 is slantly bent in the first bending area B/A1, a part of the flexible substrate 101 bent downwards may be protruded from the boundary line of the flexible substrate 101 in the main area M/A. The part protruded from the boundary line of the flexible substrate 101 may hinder implementation of a narrow bezel. However, the flexible display device 100 according to an exemplary embodiment of the present disclosure includes the first bending area B/A1 having the width W1 smaller than the width W2 of the main area M/A. Also, the flexible display device 100 according to an exemplary embodiment of the present disclosure includes the flexible substrate 101 bent in the second bending area B/A2 and the third bending area B/A3. Thus, even if the flexible substrate 101 is slantly bent in the first bending area B/A1, the protrusion from the boundary line of the flexible substrate 101 can be minimized. Therefore, a narrow bezel of the flexible display device 100 can be implemented.

Further, the flexible display device 100 according to an exemplary embodiment of the present disclosure includes the outer pad parts 105A and 105B and the outer lines 160 which are not exposed to the outside, but sealed by the passivation layer 105 or protection layer 106. Thus, corrosion of the lines 130 caused by exposure of the outer lines 160 can be minimized. Details thereof will be described with reference to FIG. 5A and FIG. 5B.

Figure 5A:
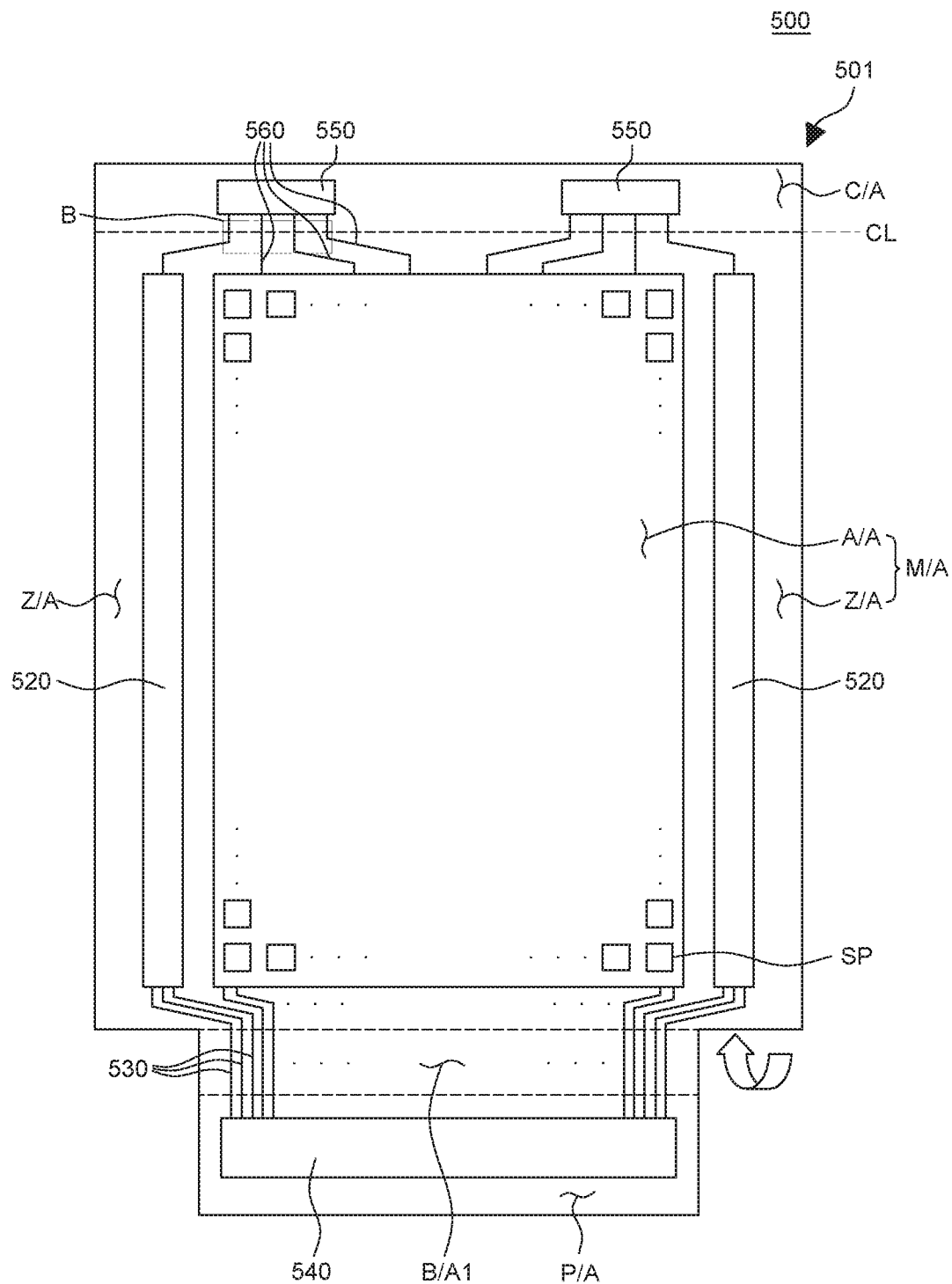
FIG. 5A and FIG. 5B are a schematic plan view and an enlarged plan view, respectively, provided to explain corrosion of lines occurring in a typical flexible display device.
Figure 5B:
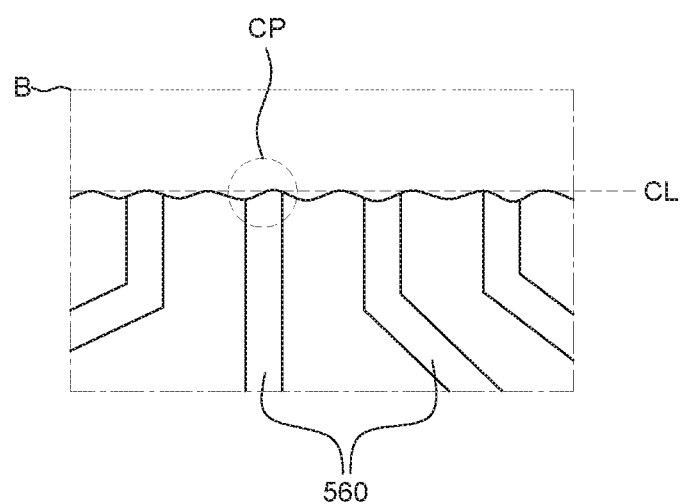

FIG. 5A and FIG. 5B are a schematic plan view and an enlarged plan view, respectively, provided to explain corrosion of lines occurring in a typical flexible display device.

Referring to FIG. 5A, a typical flexible display device 500 is the same as the display device according to an exemplary embodiment of the present disclosure except that an outer pad part 550 is disposed on a cut area C/A at an upper end of the main area M/A. That is, the typical flexible display device 500 includes a flexible substrate 501, and the flexible substrate 501 includes the main area M/A, the first bending area B/A1, and the pad area P/A. In the main area M/A, a driver 520 and sub-pixels SP are disposed. In the first bending area B/A1, lines 530 connected to the driver 520 and sub-pixels SP are extended. The flexible substrate 501 is bent in the first bending area B/A1. Also, in the pad area P/A, a pad part 540 connected to the lines 530 is disposed.

Meanwhile, in the typical flexible display device 500, the outer pad part 550 used for a test on the flexible display device 500 is disposed on the cut area C/A at an upper end of the flexible substrate 501. The outer pad part 550 is connected to outer lines 560, and the outer lines 560 are directly connected to sub-pixels SP in the active area A/A and the driver 520 in the bezel area Z/A. A test signal applied to the outer pad part 550 is transmitted to the sub-pixels SP and the driver 520 through the outer lines 560, and a lighting test may be performed to the sub-pixels SP on the basis of the test signal.

As described above, the outer pad part 550 and the outer lines 560 are used only in a test on the flexible display device 500. Therefore, the outer pad part 550 and the outer lines 560 may be removed from the completely manufactured flexible display device 500. Specifically, after a test is ended, an upper end portion of the flexible substrate 501 may be cut along the cutting line CL and the cut area C/A is removed. Then, the flexible substrate 501 in the first bending area B/A1 is bent. Thus, it is possible to provide the flexible display device 500 having a narrow bezel.

However, since the flexible substrate 501 is cut along the cutting line CL, a cross-section of the outer line 560 may be exposed to the outside. Specifically, referring to FIG. 5B, when the flexible substrate 501 is cut along the cutting line CL, the outer line 560 can also be cut. Thus, a cut portion CP of the outer line 560 is exposed to the outside. In this case, moisture may infiltrate into the outer line 560 through the cut portion CP. The outer line 560 exposed to the moisture may be corroded rapidly by the moisture. Also, the moisture may infiltrate into the other lines in the active area A/A connected to the outer line 560 and cause corrosion of the lines in the active area A/A. Particularly, if a passivation layer that protects the outer line 560 in the cut portion CP is cracked by the cutting process, the moisture may more easily infiltrate into the other lines through the cracks in the passivation layer. Therefore, the lines may be corroded more rapidly.

On the contrary, the flexible display device 100 according to an exemplary embodiment of the present disclosure includes the outer pad parts 150A and 150B disposed to be spaced from both sides of the pad part 140. Further, as the flexible substrate 101 is bent in the second bending area B/A2 and the third bending area B/A3, the outer pad parts 150A and 150B are overlapped with the pad part 140. Furthermore, as the flexible substrate 101 is bent in the first bending area B/A1, the outer pad parts 150A and 150B and the pad part 140 are positioned under the main area M/A of the flexible substrate 101. Thus, the first outer pad area OP/A1 and the second outer pad area OP/A2 where the outer pad parts 150A and 150B are disposed may not be cut out. Since the first outer pad area OP/A1 and the second outer pad area OP/A2 are not cut out, the outer lines 160 connected to the outer pad parts 150A and 150B may not be cut and may not be exposed to the outside. Particularly, the passivation layer 105 and the protection layer 106 that suppress infiltration of moisture and foreign materials are disposed on the outer lines 160 and the protection layer 106 is disposed on the outer pad parts 150A and 150B. Therefore, infiltration of moisture through the outer lines 160 and the outer pad parts 150A and 150B can be further suppressed.

Further, the flexible substrate 501 is cut using a high-energy laser. Therefore, in the typical flexible display device 500, short defects of the outer lines 560 may occur. Specifically, when the flexible substrate 501 is cut along the cutting line CL, the surrounding neighborhood of the cut portion CP may be burnt by the high-energy laser. In this case, the burnt materials containing carbon may be generated around the cut portion CP and may cause a short defect between the outer lines 560 adjacent thereto. As described above, the outer lines 560 are connected to the sub-pixels SP disposed in the active area A/A. Thus, if a short defect occurs between the outer lines 560, electrodes of the sub-pixels SP may be electrically connected to each other and defects may occur in the sub-pixels SP. However, in the flexible display device 100 according to an exemplary embodiment of the present disclosure, the outer lines 160 and the outer pad parts 150A and 150B are not cut, and, thus, the above-described short defect may not occur.

Figure 6:
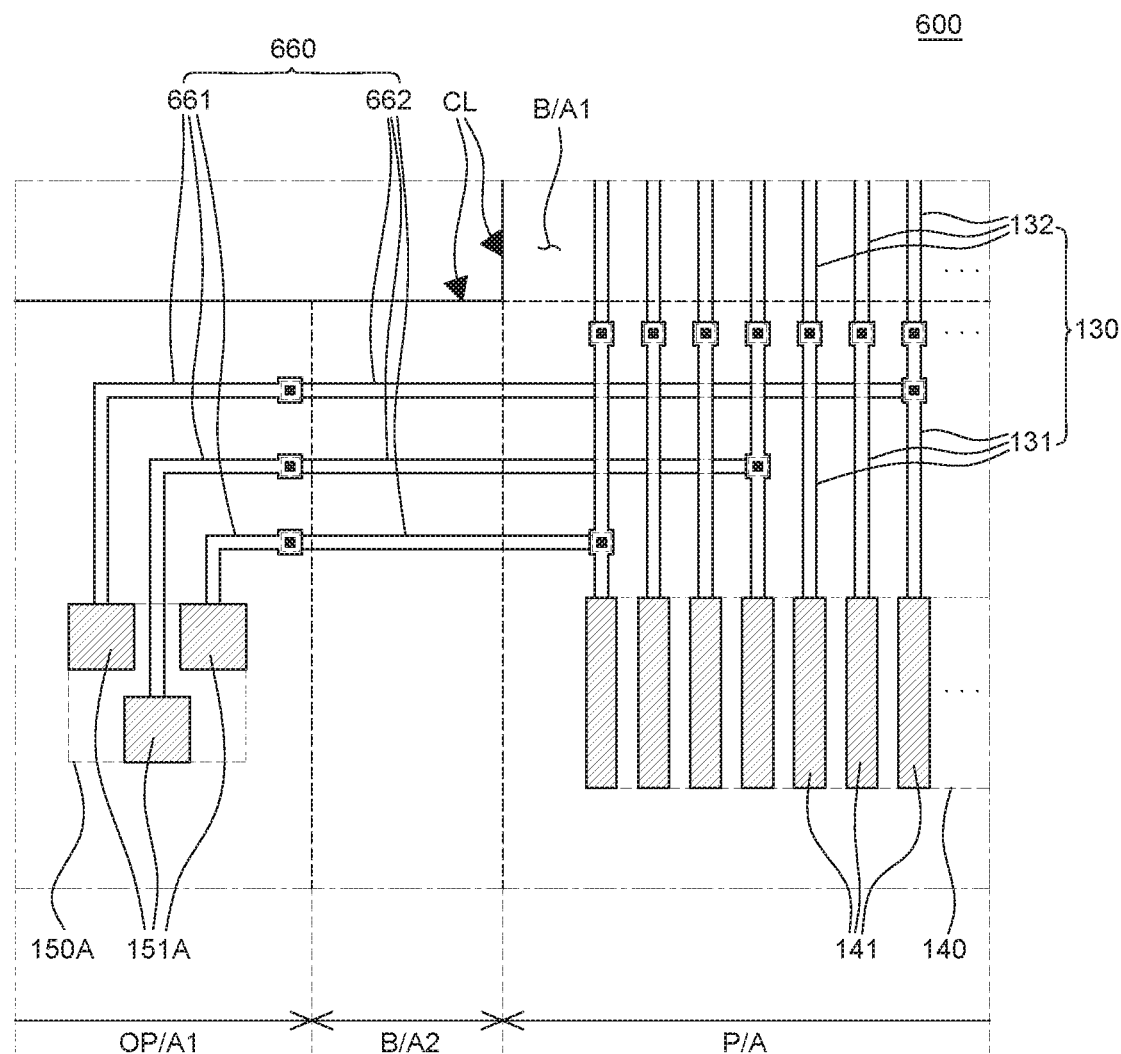
FIG. 6 is a schematic enlarged plan view illustrating a pad part of a flexible display device according to another exemplary embodiment of the present disclosure.

FIG. 6 is a schematic enlarged plan view illustrating a pad part of a flexible display device according to another exemplary embodiment of the present disclosure. The flexible display device according to another exemplary embodiment of the present disclosure is the same as the flexible display device according to an exemplary embodiment of the present disclosure as illustrated in FIG. 1 to FIG. 3 except that a plurality of outer lines 660 is in direct contact with the plurality of lines 130. Therefore, a redundant explanation thereof will be omitted.

Referring to FIG. 6, each of the plurality of outer lines 660 includes a first outer line 661 and a second outer line 662. The first outer lines 661 are connected to the first outer pads 151A in the first outer pad area OP/A1, and the second outer lines 662 are extended in the second bending area B/A2. The second outer lines 662 are connected to the first outer lines

661, respectively, in the first outer pad area OP/A1 and the first lines 131, respectively, in the pad area P/A.

The first outer lines 661 and the second outer lines 662 are disposed on different planes from each other. Specifically, the second outer lines 662 are disposed on a plane positioned lower than a plane on which the first outer lines 661 are disposed. Therefore, in the pad area P/A, the second outer lines 662 are extended to lower parts of the first lines 131, respectively, but may not be limited thereto. The second outer lines 662 may be extended to upper parts of the first lines 131, respectively.

Further, FIG. 6 illustrates that the second outer lines 662 and the first outer lines 661 are connected to each other in the first outer pad area OP/A1. However, the first outer lines 661 and the second outer lines 662 may be configured as connected to each other in the pad area P/A. That is, the first outer lines 661 may be extended from the first outer pads 151A to the second bending area B/A2 and may be in contact with the second outer lines 662 in the pad area P/A. In the pad area P/A, the second outer lines 662 may be extended to the lower or upper parts of the first lines 131 and may be connected to some of the first lines 131.

During the test process, the first outer pads 151A are connected to the test device and applied with a test signal. The test signal applied to the first outer pads 151A is transmitted to the first lines 131 through the first outer lines 661 and the second outer lines 662. The first lines 131 are connected to the second lines 132 extended in the first bending area B/A1, and the second lines 132 are connected to the sub-pixels SP and the driver 120. Therefore, the test signal transmitted to the second outer lines 662 is transmitted to the sub-pixels SP through the first lines 131 and the second lines 132.

In the flexible display device according to another exemplary embodiment of the present disclosure, the outer lines 660 are directly connected to the lines 130. Thus, the degree of freedom in design of the flexible display device can be improved. Specifically, if the outer lines 660 are connected to the pads 141 of the pad part 140, the outer lines 660 are extended to a lower end portion of the pad part 140 to suppress contact between the outer lines 660 and the lines 130, as illustrated in FIG. 1 and FIG. 2. In this case, a space for the outer lines 660 may be needed. However, if the outer lines 660 are directly connected to the lines 130, the outer lines 660 may be extended toward an upper end of the outer pad part 150A and then directly connected to the lines 130, as illustrated in FIG. 6. Since the second outer lines 662 and the first lines 131 are disposed on different planes from each other, the second outer lines 662 may be overlapped with the first lines 131 in the pad area P/A. Thus, a sufficient space for the outer lines 660 can be secured and a layout of the outer lines 660 can be easily designed.

The exemplary embodiments of the present disclosure can also be described as follows:

According to an aspect of the present disclosure, there is provided a flexible display device. The flexible display device includes a flexible substrate, a plurality of sub-pixels, a plurality of lines, a pad part, an outer pad part, and a plurality of outer lines. The plurality of lines is connected to the plurality of sub-pixels. The pad part is connected to the plurality of lines. The outer pad part is disposed to be spaced from the pad part. The plurality of outer lines is connected to the outer pad part. The flexible substrate is bent in a first bending area where the plurality of lines is disposed, and the flexible substrate is bent in a second bending area where the plurality of outer lines is disposed. The flexible display device according to an exemplary embodiment of the present disclosure includes the flexible substrate which is bent in the second bending area where the plurality of outer lines is disposed and the first bending area where the plurality of lines is disposed. Thus, the pad part and the outer pad part may be overlapped with each other, and in the flexible display device, the size of an area where an image is not displayed may be reduced. Therefore, it is possible to provide the flexible display device having a narrow bezel. Further, the outer lines are not cut, but bent. Thus, it is possible to minimize corrosion of lines caused by moisture infiltrating through a cut portion and also possible to reduce a fraction defective of the flexible display device.

According to another feature of the present disclosure, a width of the first bending area may be smaller than a width of a main area where the plurality of sub-pixels is disposed.

According to yet another feature of the present disclosure, the outer pad part may include a plurality of first outer pads spaced from one side of the pad part and a plurality of second outer pads spaced from the other side of the pad part.

According to still another feature of the present disclosure, a pad area where the pad part is disposed, the second bending area, and an outer pad area where the outer pad part is disposed are positioned in parallel with each other, and the width of the first bending area may be smaller than a total width of the pad area, the second bending area, and the outer pad area.

According to still another feature of the present disclosure, an upper surface of the outer pad part may face a lower surface of the flexible substrate in the main area.

According to still another feature of the present disclosure, a bending radius of the flexible substrate bent in the first bending area may be greater than a bending radius of the flexible substrate bent in the second bending area.

According to still another feature of the present disclosure, the pad part may include a plurality of pads, and a distance from one side of an outermost pad among the plurality of pads to a boundary line of the second bending area facing the one side of the outermost pad may be 600 µm or more.

According to still another feature of the present disclosure, the plurality of outer lines may be in direct contact with some of the plurality of pads or some of the plurality of lines.

According to still another feature of the present disclosure, the flexible display device may further include a passivation layer configured to cover the plurality of lines and the plurality of outer lines, and a protection layer configured to cover the outer pad part and cover the passivation layer in the first bending area and the second bending area.

According to still another feature of the present disclosure, the flexible display device may further include a connection circuit board which is in contact with the pad part among the pad part and the outer pad part.

According to another aspect of the present disclosure, there is provided a flexible display device. The flexible display device includes a plurality of sub-pixels on a flexible substrate, a pad part electrically connected to the plurality of sub-pixels, and an outer pad part spaced from the pad part. The plurality of sub-pixels is disposed on a main area of the flexible substrate, the pad part is disposed on a pad area spaced from the main area, and the outer pad part is disposed on an outer pad area spaced from the pad part. A first bending area is positioned between the main area and the pad area, and a second bending area is positioned between the pad area and the outer pad area. The first bending area is bent such that a direction of a first normal vector perpendicular to an upper surface of the main area of the flexible substrate is opposite to a direction of a second normal vector perpendicular to an upper surface of the pad area of the flexible substrate. The second bending area is bent such that a direction of a third normal vector perpendicular to an upper surface of the outer pad area of the flexible substrate is opposite to the direction of the second normal vector.

According to another feature of the present disclosure, the flexible display device may further include a plurality of lines connected to the pad part and extended to the first bending area, a plurality of outer lines connected to the outer pad part and extended to the second bending area, a passivation layer configured to cover the plurality of lines and the plurality of outer lines, and a protection layer configured to cover the outer pad part and cover the passivation layer in the first bending area and the second bending area.

According to yet another feature of the present disclosure, a width of the first bending area may be smaller than a width of the main area.

According to still another feature of the present disclosure, a bending radius of the flexible substrate bent in the first bending area may be greater than a bending radius of the flexible substrate bent in the second bending area.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
a plurality of sub-pixels on a substrate;
a pad part electrically connected to the plurality of sub-pixels;
an outer pad part spaced from the pad part,
wherein:
the plurality of sub-pixels is disposed on a main area of the substrate,
the pad part is disposed on a pad area spaced from the main area, and the outer pad part is disposed on an outer pad area spaced from the pad part,
a first bending area is positioned between the main area and the pad area, and a second bending area is positioned between the pad area and the outer pad area,
the first bending area is bent such that a direction of a first normal vector perpendicular to an upper surface of the main area of the substrate is opposite to a direction of a second normal vector perpendicular to an upper surface of the pad area of the substrate, and
the second bending area is bent such that a direction of a third normal vector perpendicular to an upper surface of the outer pad area of the substrate is opposite to the direction of the second normal vector;
a plurality of lines connected to the pad part and extended to the first bending area;
a plurality of outer lines connected to the outer pad part and extended to the second bending area;
a passivation layer configured to cover the plurality of lines and the plurality of outer lines; and
a protection layer configured to cover the outer pad part and cover the passivation layer in the first bending area and the second bending area.

2. The flexible display device according to claim 1, wherein a width of the first bending area is smaller than a width of the main area.

3. The flexible display device according to claim 2, wherein the outer pad part includes:
a plurality of first outer pads spaced from one side of the pad part; and
a plurality of second outer pads spaced from the other side of the pad part.

4. The flexible display device according to claim 3, wherein the pad area, the second bending area, and the outer pad area are positioned in parallel with each other, and
the width of the first bending area is smaller than a total width of the pad area, the second bending area, and the outer pad area.

5. The flexible display device according to claim 1, wherein an upper surface of the outer pad part faces a lower surface of the substrate in the main area.

6. The flexible display device according to claim 1, wherein the pad part includes a plurality of pads, and
a distance from one side of an outermost pad among the plurality of pads to a boundary line of the second bending area facing the one side of the outermost pad is 600 μm or more.

7. The flexible display device according to claim 6, wherein the plurality of outer lines is in direct contact with some of the plurality of pads or some of the plurality of lines.

8. The flexible display device according to claim 1, further comprising:
a connection circuit board which is in contact with the pad part among the pad part and the outer pad part.

9. The flexible display device according to claim 1, wherein a bending radius of the substrate bent in the first bending area is greater than a bending radius of the substrate bent in the second bending area.

10. The flexible display device according to claim 1, further comprising a driver disposed on the substrate, the driver connected to a plurality of driving lines which includes at least one of first driving lines and second driving lines.

11. The flexible display device according to claim 10, wherein the first driving lines connects the driver and the pad part, and
wherein the second driving lines connects to one of the first driving lines on the first bending area.

12. The flexible display device according to claim 11, wherein the first driving lines and second driving lines are disposed on different layers from each other.

13. The flexible display device according to claim 11, wherein the first lines, first outer lines and first driving lines are disposed on the same layer, and
wherein the second lines, second outer lines and second driving lines are disposed on the same layer.

* * * * *